United States Patent

[11] 3,603,847

[72] Inventors Freeman D. Shepherd, Jr. Chelmsford; Virgil E. Vickers, Cambridge; Andrew C. Yang, Concord, all of, Mass.

[21] Appl. No. 832,111
[22] Filed June 11, 1969
[45] Patented Sept. 7, 1971
[73] Assignee The United States of America as represented by the Secretary of the Air Force

[54] SCHOTTKY BARRIER PHOTODIODE WITH A DEGENERATE SEMICONDUCTOR ACTIVE REGION
1 Claim, 2 Drawing Figs.

[52] U.S. Cl. .......... 317/234 R, 317/235 N, 317/235 UA, 317/235 AC, 317/235 AM
[51] Int. Cl. .......... H01l 9/00, H01l 15/00
[50] Field of Search .......... 317/235, 234

[56] References Cited

UNITED STATES PATENTS

| | | | |
|---|---|---|---|
| 3,530,011 | 9/1970 | Suzuki et al. | 148/1.5 |
| 3,424,890 | 1/1969 | Van Ruyven | 219/121 |

OTHER REFERENCES

R. L. Anderson, I.B.M. Journal, July 1960, Article entitled " Germanium-Gallium Arsenide Meterojunctions."
Chang et al., I.B.M. Tech. Discl. Bull., Vol. 11, No. 2, July 1968, page 92–93 rebid on

*Primary Examiner*—John W. Huckert
*Assistant Examiner*—Martin H. Edlow
*Attorneys*—Harry A. Herbert, Jr. and William J. O'Brien

ABSTRACT: A Schottky barrier photodiode possessing a high quantum efficiency and adapted to operate at long wavelengths. The photodiode is fabricated by providing a non-degenerate semiconductor substrate of one extrinsic conductivity type with a thin layer of a degenerate semiconductor material of the same extrinsic conductivity type as said substrate to form a barrier junction therebetween. The improved quantum efficiency exhibited by the photodiode of this invention is attributed to the use of a degenerate material as the active region.

INVENTORS.
FREEMAN D. SHEPHERD JR.
VIRGIL E. VICKERS
BY ANDREW C. YANG
Harry A. Herbert Jr. and
William J. O'Brien
ATTORNEYS

SCHOTTKY BARRIER PHOTODIODE WITH A DEGENERATE SEMICONDUCTOR ACTIVE REGION

BACKGROUND OF THE INVENTION

The present invention relates to semiconductor device. More particularly, the present invention concerns itself with a surface barrier photodiode utilizing the Schottky effect. The Schottky effect is based upon the rectification characteristics exhibited by a metal to semiconductor interface and is well known in the art. Generally, the electrical characteristics of the diode that utilize this effect depend upon the work function of the metal coating as well as the electron affinity of the semiconductor substrate. These diodes are of two types, both of which are fabricated by plating a metal layer onto the surface of a semiconductor substrate. In the first type, referred to as the intrinsic Schottky barrier photodiode, light energy greater than the energy gap of the semiconductor forms electron-hole pairs in the substrate crystal which are then collected by the diode energy barrier. These devices have high quantum efficiencies but are restricted to short wavelength operation. The second type is referred to as the hot electron Schottky barrier photodiode and the light energy excites carriers in the metal coating rather than in the substrate crystal. These devices operate at longer wavelengths but have low quantum efficiencies of less than two percent.

With the present invention, however, the problems prevalent with prior art Schottky barrier photodiodes can be overcome by providing a device which comprises a nondegenerate semiconductor substrate with a thin layer of a degenerate semiconductor material disposed on the surface of the substrate. The photodiodes of the invention possess an improved quantum efficiency over that exhibited by the metal-coated diodes of the prior art. The improved efficiency is obtained by using the degenerate semiconductor material for the active region. In addition, the photodiode device of this invention operates at long wavelengths and thus incorporates the advantageous features of both of the prior art Schottky barrier photodiode devices without encountering their disadvantages.

SUMMARY OF THE INVENTION

In accordance with the present invention it has been found that Schottky barrier photodiodes having improved quantum efficiencies and operable at longer wavelengths can be fabricated by providing a nondegenerate semiconductor substrate with a thin film of a semiconductor material which has been doped to a sufficiently high concentration to render it degenerate. The fundamental quantum efficiency is increased markedly as compared to ordinary Schottky barrier photodiodes which employ a metal film as the active region rather than a degenerate semiconductor film contemplated by this invention.

Accordingly, the primary object of this invention is to provide an improved Schottky barrier photodiode.

A further object of this invention is to provide a Schottky barrier photodiode having a degenerate semiconductor area as the active region.

Still another object of this invention is to provide a Schottky barrier photodiode which is characterized by a high quantum efficiency and is operable at long wavelengths.

The above and still further objects and advantages of this invention will become apparent upon consideration of the following detailed description thereof when taken in conjunction with the accompanying drawing.

BRIEF DESCRIPTION OF THE DRAWING

In the drawing:

Referring now to FIG. 1 in the drawing, there is disclosed a barrier photodiode comprising a wafer 10 of semiconductor material typically having a thickness of about 0.004 to 0.008 inches. On the surface 12 of the wafer 10 there is shown a degenerate semiconductor film 14 which has been deposited thereon by conventional epitaxial techniques well known in the art.

Figure 1:
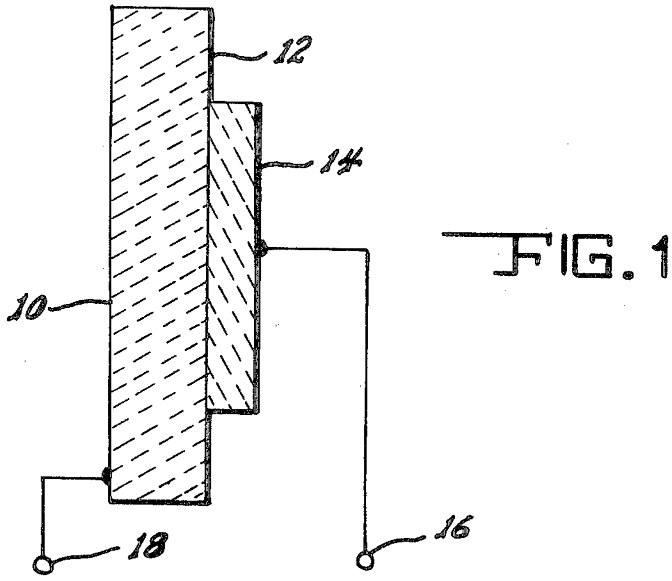
FIG. 1 represents a cross sectional view of the photodiode of this invention.

The term epitaxial characterizes a deposited single crystal layer having the same crystal orientation as the substrate crystal. Conveniently the film 14 can be provided by exposing the surface of the semiconductor substrate 10 to the vapors of a halide compound of the semiconductor material. The halide compound has sufficient impurities and is of a suitable conductivity type to form a degenerate semiconductor film on the exposed surface portion 12. This results in the fabrication of a photodiode device having a nondegenerate semiconductor substrate with a degenerate semiconductor film deposited on the surface thereof to form a barrier junction therebetween. Finally, electrodes 16 and 18 are applied to complete the device.

The semiconductor wafer 10 may be any of the well-known P-type of N-type semiconductor materials such as silicon, germanium or gallium arsenide. The degenerate semiconductor film 14 is heavily doped in such a manner that it acts like a metal and may be any of the well known semiconductor materials such as silicon, germanium, gallium arsenide, indium arsenide, lead sulfide, lead selenide, and lead telluride and may be either the same material or a different material than the substrate semiconductor material.

In this connection the term degenerate characterizes a region in which the fermi level lies outside the forbidden energy gap for the particular material utilized. In the case of germanium, the impurity concentration is in excess of about $7 \times 10^{18}$ atoms per cubic cc. When the semiconductor material is sufficiently doped to approach degeneracy then it acts like a metal with its fermi level inside either the conduction or valence band at the temperature of operation. The term nondegenerate refers to a region in which the fermi level lies within the forbidden energy gap.

In the device of this invention the degenerate semiconductor film 12 is of the same conductivity type as the substrate semiconductor material. That is an N-type degenerate-type semiconductor would be deposited upon an N-type semiconductor wafer or alternatively a P-type deposited on a P-type. Generally, the degenerate semiconductor material is the same as the semiconductor material of the substrate.

In a specific example, the photodiode device of this invention comprises an N-type gallium arsenide wafer 10, $0.20 \times 0.20 \times 0.01$ inch.

The next step in accordance with a preferred embodiment of the present invention is the deposition of a thin film 14 of heavily doped germanium onto the surface 12 of the gallium arsenide substrate. The germanium is doped to a level of approximately $10^{19}$ atoms/cc. to render it degenerate and is of an N-type conductivity. The degenerate material is disposed, for example, by a conventional epitaxial technique generally known as vapor growth whereby the material 14 is decomposed from a halide vapor that is formed by reacting a source of germanium with a halogen transport element. Following deposition, a suitable electric lead 16 and ohmic contact 18 are attached to complete the device.

Prior to this invention, Schottky barrier photodiodes have been constructed by evaporating metals on semiconductor substrates. These devices have had inherently low quantum efficiencies because the large fermi energy of the metal led to an inefficient photoelectronic conversion process. For a typical metallic fermi energy of 5 electron volts, quantum efficiencies are constrained to be less than 1 percent at infrared wavelengths. In this invention the photodiode is fabricated by evaporating or growing a thin degenerate semiconductor layer 14 on the semiconductor substrate crystal 10.

Light incident on the degenerate semiconductor 14 either from outside or inside the device, excites electrons which are collected by the barrier between the substrate 10 and the active region 14. The use of a degenerate material in the active layer 14 lowers the fermi energy to the range $$0<E_f<0.5 \text{ electron volts}$$

Figure 2:
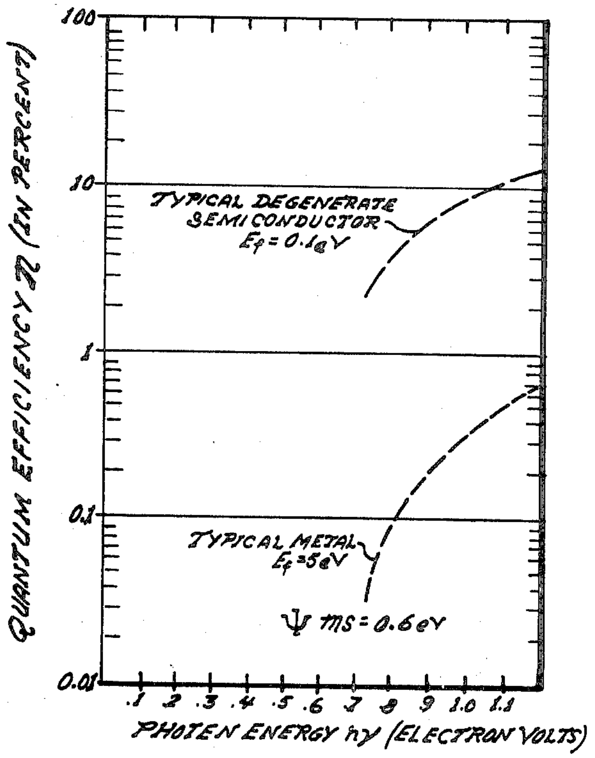
FIG. 2 represents a diagrammatical illustration showing comparable quantum efficiencies of a photodiode device of this invention and a typical metal coated photodiode of the prior art.

The resulting changes in quantum efficiency for a typical device are shown in FIG. 2 where $E_f$ is a parameter. Note that the quantum efficiency increases markedly as $E_f$ drops from 5 ev. to 0.1 ev.

In order to further clarify the advantages and improved efficiencies attendant the operation of the present invention there is presented the following information. We begin, however, with five assumptions.

First, in the evaporated or grown active region 14 of the device we assume a uniform density of allowed states throughout the corresponding allowed area in $k$-space, with associated energy $$E=\frac{\hbar^2|\mathbf{k}|^2}{2m_e}$$

(i.e., the metal is isotropic, with an $E$ vs.-$k$ relation described by an effective mass $m_e$), and that these states are filled up to the fermi level, $E_f$.

Secondly, we assume that all electrons within $h\nu$ of the fermi level have equal probabilities of being excited (where $h\nu$ is the energy of an incident photon).

Thirdly, we assume that the excitation process does not lead to any preferred orientation of the k-vector, so that the probability that an excited state of energy $E'$ has its k-vector lying within a certain solid angle is equal to the probability that the probability that a state of energy $E = E'-h\nu$ has its $k$-vector lying within that same solid angle.

We assume further that the excited electrons will be captured if, and only if:

a. the sign of $k'_x$ is such as to carry them toward the metal semiconductor barrier, and b. the magnitude of $k'_x$ is such as to carry them over the barrier:

$$\frac{\hbar^2 \mathbf{k}_x'^2}{2m_e}\geq E_F+\Psi_{ms}$$

and finally

We assume small excitation, so that all events are independent.

These five assumptions lead to closed-form expressions for the junction efficiency $$\eta=\frac{n_{captured}}{n_{excited}}$$

expressed in terms of $E_f$, the barrier height $\Psi_{ms}$, and the photon energy $h\nu$, as follows:

$$n_{excited}=\int PN_k dk_x dk_y dk_z$$

where $P$ is the excitation probability per unit time per state, $N_k$ is the number of states per unit volume in $k$-space, and the integral is taken over the appropriate volume; the expression for $n_{captured}$ is identical in form, differing only in that the integral is taken over a more restricted volume.

The problem clearly calls for solution in spherical coordinates with volume element $k^2_r$ sin $\theta$ d$\theta$ $dk_r d\Phi$, where we will measure the colatitude $\theta$ from the minus X-axis and the longitude $\Phi$ around the X-axis Now we will define $$r\equiv\sqrt{E}=\frac{\hbar|k|}{\sqrt{2m_e}}=\frac{\hbar}{\sqrt{2m_e}}k_r$$

so that $$dr=\frac{\hbar}{\sqrt{2m_e}}dk_r$$

and $$n_{excited}=PN_k\left(\frac{\hbar}{\sqrt{2m_e}}\right)^{-3}\int_0^{2\pi}\int_{r_L}^{r_F}\int_0^{\pi}r^2\sin\theta d\theta dr d\phi$$

where we have defined $$r_F\equiv\sqrt{E_F}$$

$$r_L\equiv\sqrt{\text{Greater }[0,\ E_F-h\nu]}$$

By assumptions 3 and 4*b*, we see that the inner surface of the captured volume is described by $$\cos\theta(r)=\frac{\sqrt{E_F+\Psi_{ms}}}{\sqrt{r^2+h\nu}}$$

between $$r=r_D\equiv\sqrt{\text{Greater }[0,\ E_F+\Psi_{ms}-h\nu]}$$

and $$r=r_F$$

so that $$n_{captured}=PN_k\left(\frac{\hbar}{\sqrt{2m_e}}\right)^3\int_0^{2\pi}\int_{r_D}^{r_F}\int_0^{\cos^{-1}\frac{r_p}{\sqrt{r^2+h\nu}}}r^2\sin\theta d\theta dr d\phi$$

where we have also defined $$r_p\equiv\sqrt{E_F+\Pi_{ms}}$$

Hence we obtain $$\eta=\frac{\int_{r_D}^{r_F}\int_0^{\cos^{-1}\frac{r_p}{\sqrt{r^2+h_\mu}}}r^2\sin\theta d\theta dr}{\int_{r_L}^{r_F}\int_0^{\pi}r^2\sin\theta d\theta dr}$$

$$=\frac{\int_{r_D}^{r_F}\left[r^2-\frac{r^2 r_D}{\sqrt{r^2+h\nu}}\right]dr}{\int_{r_L}^{r_F}2r^2dr}$$

$$=\frac{\left[\frac{r^3}{3}-\frac{rr_p\sqrt{r^2+h\nu}}{2}+\frac{r_p h\nu}{2}1n\,(r+\sqrt{r^2+h\nu})\right]_{r_D}^{r_F}}{\left[\frac{2r^3}{3}\right]_{r_L}^{r_F}}$$

$$=\frac{r_F{}^3-r_D-\frac{3}{2}r_p\left(r_F r_N-r_D r_p'-h\nu 1n\ \frac{r_F+r_N}{r_D+r_p'}\right)}{2(r_F{}^3-r_L{}^3)}$$

where we have defined $$r_N\equiv\sqrt{r^2{}_F+h\nu}$$

and $$r_p'\equiv\sqrt{r^2{}_D+h\nu}$$

From a consideration of the foregoing, it can be seen that the Schottky barrier photodiode of this invention provides a device having a high quantum efficiency and characterized by having an operational feasibility at long wavelengths.

What is claimed is:

1. A surface barrier photodiode consisting essentially of a wafer of a monocrystalline, gallium arsenide, nondegenerate, semiconductor material having an extrinsic conductivity; a thin photon-absorbing layer of a degenerate semiconductor material having the same type of conductivity and disposed upon and contiguous with one surface of said wafer; said layer consisting essentially of arsenic-doped germanium containing about 1 × $10^{19}$ atoms of arsenic per cc. and ohmic contacts disposed upon and contiguous to one surface of said wafer and one surface of said thin layer.